US007151697B2

(12) United States Patent
Riedel et al.

(10) Patent No.: US 7,151,697 B2
(45) Date of Patent: Dec. 19, 2006

(54) NON-VOLATILE SEMICONDUCTOR MEMORY

(75) Inventors: Stephan Riedel, Dresden (DE); Elard Stein von Kamienski, Dresden (DE); Norbert Schulze, Radebeul (DE)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 11/000,335

(22) Filed: Nov. 30, 2004

(65) Prior Publication Data

US 2006/0114724 A1 Jun. 1, 2006

(51) Int. Cl.
*G11C 11/34* (2006.01)

(52) U.S. Cl. .................. 365/185.27; 365/185.23; 365/185.29; 365/185.11

(58) Field of Classification Search ............ 365/185.27, 365/185.23, 185.29, 185.11
See application file for complete search history.

(56) References Cited

U.S. PATENT DOCUMENTS

| | | | |
|---|---|---|---|
| 5,097,303 A | 3/1992 | Taguchi | |
| 5,243,559 A | 9/1993 | Murai | |
| 5,515,319 A | 5/1996 | Smayling et al. | |
| RE37,311 E * | 8/2001 | Kato et al. | 365/185.27 |
| 6,445,618 B1 * | 9/2002 | Atsumi et al. | 365/185.27 |
| 6,621,325 B1 * | 9/2003 | Hart et al. | 327/534 |
| 6,731,544 B1 * | 5/2004 | Han et al. | 365/185.28 |
| 6,747,899 B1 * | 6/2004 | Hsia et al. | 365/185.28 |
| 6,757,198 B1 | 6/2004 | Huang et al. | |
| 6,791,884 B1 | 9/2004 | Matsuda et al. | |
| 2004/0031996 A1 * | 2/2004 | Li et al. | 257/408 |

\* cited by examiner

*Primary Examiner*—Richard Elms
*Assistant Examiner*—N Nguyen
(74) *Attorney, Agent, or Firm*—Slater & Matsil, L.L.P.

(57) ABSTRACT

A non-volatile semiconductor memory includes a substrate having a substrate region, at least one word line, a plurality of non-volatile memory cells arranged in a plurality of sectors and further comprising first wells of a first doping type, electrically insulating elements and switching elements. Each sector includes a plurality of non-volatile memory cells commonly arranged in a respective first well. The at least one word line electrically connecting memory cells of a group of sectors among the plurality of sectors. The first wells are separated from the substrate region and from each other by means of the electrically insulating elements. Each first well is connected to a respective switching element and the semiconductor memory is constructed such that each first well is biasable to a predetermined potential by means of the respective switching element. Further, a method is provided for operating the above non-volatile semiconductor memory.

38 Claims, 4 Drawing Sheets

NON-VOLATILE SEMICONDUCTOR MEMORY

TECHNICAL FIELD

The present invention relates to non-volatile semiconductor memories and to methods for operating such memories.

BACKGROUND

Flash memories are high density non-volatile memories and may be divided into data flash and code flash memories.

Data flash memories are typically used for storing large data volumes in applications such as digital cameras, MP3 players and other electronic products. These applications require a large numbers of cells in each sector. The requirements regarding the reliability of data flash memories are less strict than for code flash memories. In order to minimize the area required for each memory cell, NAND architectures are used. However, NAND architectures lead to slower access times.

Code flash memories are typically used for storing program code in applications such as personal computers, mobile telephones, personal digital assistants and other electronic devices. This type of memory needs to meet higher reliability demands than data flash memories. NOR architectures are used to reduce access times. As smaller portions of memories need to be accessible for read, write or erase operations, sectors in code flash memories are smaller than in data flash memories.

The storage capacity of flash memories can be increased by increasing the number of bits stored per cell. Nitride programmable read only memory (NROM) cells can store two bits per cell and are based on charge trapping in a nitride layer of an ONO (oxide-nitride-oxide) gate dielectric. Charge is localized in two regions of the nitride layer of each cell and the charge stored in each region can be manipulated independently. For each region, the amount of electrical charge stored determines the threshold voltage values Vth of the cell. A high threshold value Vth corresponds to a high '1' state and a low threshold value Vth '0' to a low state. By applying a gate voltage that is between the high and low threshold voltage and sensing the current flowing through the transistor, the state stored in each region of the NROM cell can be determined. Apart from being able to store two bits per cell, NROM cell based memories further have the advantage of requiring minimal electrical power and a low production complexity.

In contrast to other flash memory technologies which depending on the type of flash memory use either a NOR or NAND architecture, NROM based memories can use the so-called "virtual ground array" architecture for both data flash and code flash memories. FIG. 1 shows such a virtual ground array 26. Individual memory cells 23 are arranged along rows and columns to form a matrix. The gates of memory cells 23 arranged along rows are connected by word lines 3. The drain and source contacts of memory cells 23 arranged along columns are connected to bit lines 4, with each bit line 4 being shared between two neighboring cells (23) along rows. Each memory cell 23 in the array 26 can be selected by the respective word line 3 and bit lines 4 corresponding to the row and the column in which the memory cell is located.

Memory cells are usually grouped together in sectors so that operations, such as erasing, may easily and simultaneously be preformed on a large number of memory cells. In general a word line will pass through more than one sector, connecting the gate electrodes of memory cells belonging to different sectors. Because of the shared word line common to memory cells of plural sectors, not only the memory cells in the sector that is to be erased are biased with a high negative or positive voltage at the gate necessary for this operation. In addition, also memory cells of other sectors not to be erased but connected to the same word line are biased. The states stored in memory cells of these sectors will usually not be changed because no voltage is applied to their bit lines. However, the voltage applied to the gates of the non-selected memory cells are high enough to affect the electric charge stored in the ONO layer of the memory cells over a large number of such program or erase cycles. As a result, the threshold voltages Vth in those cells change so that it is no longer possible to distinguish between the high and low state. This is known as "gate disturb" and can lead to wrong values being read out from the memory cells.

In most flash memory products gate disturb is not suppressed even though it leads to reduced reliability of the memory. Efforts to reduce the effects of gate disturb include optimizing the thickness of, for example, the ONO layer. In another approach word lines are divided into separate word lines for each sector. The gates of the cells to be erased are connected to a word line by using a sector specific select transistor. However, this approach leads to more complicated memory constructions.

SUMMARY OF THE INVENTION

Accordingly, in one aspect, the invention provides a non-volatile semiconductor memory in which gate disturb is minimized during the erase operation. Another aspect of the invention provides a method for operating non-volatile semiconductor memories in such a way that gate disturb is reduced during the erase operation. In a further aspect, the invention reduces the current needed for erasing cells in the non-volatile semiconductor memory.

The invention provides, in accordance with a first preferred embodiment, a non-volatile semiconductor memory comprising a substrate having a substrate region, at least one word line, a plurality of non-volatile memory cells arranged in a plurality of sectors and further comprising first wells of a first doping type, electrically insulating elements and switching elements. Each sector comprises a plurality of non-volatile memory cells commonly arranged in a respective first well. The at least one word line electrically connects memory cells of a group of sectors among the plurality of sectors. The first wells are separated from the substrate region and from each other by means of the electrically insulating elements. Each first well is connected to a respective switching element, and the semiconductor memory is constructed such that each first well is biasable to a predetermined potential by means of the respective switching element. Since the first wells of the sectors are electrically insulated from each other and from the substrate by the insulating elements, they do not share electrical potentials. Therefore, erasing cells in a sector by applying the required electrical potentials will not affect the cells in other sectors. However, in order to erase cells a potential difference between the gate and the channel of a cell is required. This is achieved in the invention by electrically connecting the first wells, in which the channels of the cells are embedded in, to a predetermined potential by means of the switching elements.

Preferably, the predetermined potential to which each first well is biasable by means of the respective switching element is one of a substrate potential of the substrate region, a ground potential and a word line potential. Which potential is chosen as the predetermined potential depends on whether or not the first well contains memory cells that are to be erased or not. If the first well of a sector contains memory cells whose contents are to be erased the predetermined potential is chosen to be a substrate or a ground potential. In this case the first well is connected to substrate or ground and the potential difference between the channel and the gate of the cell necessary for erasing the cell can be applied. At the same time, if the sector contains memory cells whose contents are not to be erased, the predetermined potential is chosen to be a word line potential. In this case both the channel and the gate of the memory cell are at the word line potential and no potential difference exists between them. As a result, gate disturb is eliminated when erasing cells in another sector.

Preferably, the switching elements are transistors, each transistor comprising a first and second source/drain contact. The first source/drain contact is connected to the respective first well and the second source/drain contact is connected to the predetermined potential. Using transistors such as field effect transistors the first wells can be connected to the required predetermined potential. The transistors may be implemented in the same substrate as the memory.

Alternatively, each switching element comprises a first and a second transistor each having a first and a second source/drain contact. A first source/drain contact of the respective first transistor is connected to a word line potential and a second source/drain contact of the first transistor is connected to the respective first well. A first source/drain contact of the respective second transistor is connected to a substrate potential and a second source/drain contact of the second transistor is connected to the respective first well. The transistors are used to connect the respective first wells to either a word line or a substrate potential, depending on whether the first well contains memory cells that are to be protected against gate disturb or that are to be erased. The first and second transistor may be of opposite polarity, for example NMOS and PMOS transistors and may be controlled by the same electrical signal connected to the gates.

There is also provided, in accordance with a second embodiment, a non-volatile semiconductor memory comprising a substrate having a substrate region, at least one word line, a plurality of non-volatile memory cells arranged in a plurality of sectors and further comprising first wells of a first doping type, electrically insulating elements and switching elements. Each sector comprises a plurality of non-volatile memory cells commonly arranged in a respective first well, the at least one word line electrically connecting memory cells of a group of sectors among the plurality of sectors. The first wells are separated from the substrate region and from each other by means of the electrically insulating elements. Each first well is connected to a respective switching element, and the semiconductor memory is constructed such that each first well is electrically disconnectable from the substrate region by means of the respective switching element. Again, as in the first embodiment, the first wells of the sectors are electrically insulated from each other and from the substrate by the insulating elements. In order to erase cells a potential difference between the gate and the channel of a memory cell is required. This is achieved by electrically connecting the first wells in which the channels of the memory cells are embedded into a substrate potential by means of the switching elements. To avoid gate disturb in the memory cells that are not to be erased, the first wells in which these memory cells are embedded are disconnected from the substrate potential by means of the respective switching element. The potential of these first wells floats and assumes a level close to the word line potential, so that again the potential difference between the channel and the gate is reduced and gate disturb minimized.

Preferably, the switching elements are transistors, each transistor comprising a first and second source/drain contact. The first source/drain contact is connected to the respective first well and the second source/drain contact is connected to the substrate region. Using transistors such as field effect transistors the first wells can be connected and disconnected from the substrate potential. The transistors may be implemented in the same substrate as the memory.

Regarding the insulating elements, according to the first and second preferred embodiments, the insulating elements each preferably comprise a well of a second doping type opposite to the first doping type; each first well being embedded in a respective well of the second doping type. The first wells and the wells in which they are embedded are of opposite doping type. As a result a depletion layer which electrically insulates the two wells is formed between the two wells. As the well of the second doping type embeds the first well, the first well is electrically insulated from the substrate as well as from adjacent first wells.

Alternatively, the insulating elements comprise an isolation well of a second doping type opposite of the first doping type, all first wells being embedded in the isolation well, and shallow trench isolation structures laterally separating the first wells other from one another. Electrical insulation of the first wells from the substrate is achieved by using a single large well of opposite doping type to the first wells in which all the first wells are embedded. Again, a depletion layer is formed where the wells meet. However, the first wells are not electrically insulated from each other by the single large well so that in addition shallow trench isolation structures are placed between the first wells.

Furthermore, alternatively, the insulating elements comprise a buried insulation layer arranged between the substrate region and the first wells, and shallow trench isolation structures laterally separating the first wells from one another. Instead of using a depletion layer for insulating the first wells from the substrate as described above, a buried insulation layer is used. This layer may be an oxide layer. The first wells are further electrically insulated from each other by shallow trench isolation structures placed between adjacent first wells.

Preferably, the substrate is a silicon-on-insulator substrate. In a silicon-on-insulator substrate the substrate region is insulated from the silicon layer in which the wells are formed by a insulation layer of, for example, silicon oxide and the first wells are formed in the silicon. The advantage of using a silicon-on-insulator substrate is that very little space is required for the insulation layer.

Regarding the memory cells, according to the first or second preferred embodiment, the memory cells are nitride programmable read only memory (NROM) cells. NROM cells are the preferred cell type as they can be used in a virtual ground array for code flash and data flash memories. However, the invention can also be used with other cell types, such as floating gate memory cells.

Preferably, the nitride programmable read only memory cells each comprise a nitride layer sandwiched between two oxide layers. Electric charges are storable in the nitride layer, which is located in a gate stack above the channel of the cell. The charges tunnel from the channel of the memory cell into the nitride layer if the required voltages are applied to the word lines and the bit lines. Because of the insulation provided by the two oxide layers the charges will remain in the nitride layer even if no further voltages are applied.

Specifically, the semiconductor memory comprises bit lines arranged in the substrate and the memory cells are constructed such that electrical charges are storable in the nitride layer on two respective sides of the bit lines. By storing charges in two separate positions in the nitride layer, it is possible to store two bits per cell. The two bits can be selectively read, programmed or erased by applying the required voltages to the respective bit lines and the gate of the memory cell.

Alternatively, regarding the memory cells, according to the first or second preferred embodiment, the semiconductor memory is an electrically erasable programmable read only memory.

Preferably, according to any one of the first and second embodiments, the memory cells are connected to the bit lines such as to form a virtual ground array. A virtual ground array has the advantage of being randomly accessible like a NOR architecture while at the same time being very compact like a NAND architecture. The memory cells may also be connected to form other architectures.

Preferably, the semiconductor memory comprises a plurality of word lines arranged in groups of word lines. The sectors are arranged along a first and a second direction across a substrate surface. Memory cells of sectors arranged adjacent to one another along the first direction are electrically connected to word lines of a same respective group of word lines, and memory cells of sectors adjacent to one another along the second direction are electrically connected to word lines of other groups of word lines. In this way it is possible to erase all the memory cells in one sector by applying the erase potential to all the word lines connecting memory cells in that sector. Memory cells in sectors along the second direction may share the same bit lines as memory cells in sectors along the first direction but are not erased as no word line potential is applied.

Preferably, in each sector the memory cells arranged along the first direction are connected to a same word line. In this way only one word line is required for reading, programming or erasing the cells connected to the word line.

Preferably, in each sector the memory cells arranged along the second direction are connected to different word lines. Together with the respective bit lines it is possible to select individual cells for read, program or erase operations by applying the necessary potentials to the respective bit lines of the cell.

According to embodiments of the invention, a first method for operating a non-volatile semiconductor memory is provided, the semiconductor memory comprising a substrate having a substrate region, comprising at least one word line, a plurality of non-volatile memory cells arranged in a plurality of sectors and further comprising first wells of a first doping type, electrically insulating elements and switching elements. Each sector comprises a plurality of non-volatile memory cells commonly arranged in a respective first well. The first wells are separated from the substrate region and from each other by means of the electrically insulating elements. The memory cells of a first group of sectors are connected to a first group of word lines. Erasing the memory cells of a first sector of the first group of sectors selectively to memory cells of all other sectors of the first group of sectors comprises the steps of: electrically connecting the first well of the first sector to a first predetermined potential, and electrically connecting the first wells of all other sectors of the first group of sectors to a second predetermined potential different from the first predetermined potential. By connecting the first well of the first sector to the first predetermined potential, the potential difference between the channel and the gate required to erase the cells in the first sector can be applied. By connecting the first wells of all the other sectors to the second predetermined potential, different from the first predetermined potential, the potential difference between the channel and the gate can be minimized, thus reducing gate disturb.

Preferably, according to the first method, the first well of each sector is connected to a respective switching element. By means of the respective switching elements, the first well of the first sector is connected to a first predetermined potential and the first wells of all other sectors of the first group of sectors are connected to the second predetermined potential when the first sector is erased. The switching element can connect the first wells to alternatively the first or the second predetermined potential, depending on whether the cells in the first well are to be erased or protected from gate disturb.

Preferably, according to the first method, each first well is connected to a respective switching element, the first well of the first sector is biased to the first predetermined potential and the first wells of all other sectors of the first group of sectors are biased to the second predetermined potential by means of the respective switching elements at a time when the memory cells of the first sector are erased. In this way the potential difference between the channel and the gate is large enough to erase the cells in the first sector while the potential difference between the channel and the gate of the cells in all other sectors is negligible, thus reducing gate disturb.

According to embodiments of the invention, a second method for operating a non-volatile semiconductor memory is provided, the semiconductor memory comprising a substrate having a substrate region, comprising at least one word line, a plurality of non-volatile memory cells arranged in a plurality of sectors and further comprising first wells of a first doping type, electrically insulating elements and switching elements. Each sector comprises a plurality of non-volatile memory cells commonly arranged in a respective first well. The first wells are separated from the substrate region and from each other by means of the electrically insulating elements. The memory cells of a first group of sectors being connected to a first group of word lines. Erasing the memory cells of a first sector of the first group of sectors selectively to memory cells of all other sectors of the first group of sectors comprises the steps of: electrically connecting the first well of the first sector to a first predetermined potential, and electrically disconnecting the first wells of all other sectors of the first group of sectors from the first predetermined potential. By connecting the first well of the first sector to the first predetermined potential, the potential difference between the channel and the gate required to erase the cells in the first sector can be applied. By disconnecting the first wells of all the other sectors from the first predetermined potential, the potential difference between the channel and the gate of the memory cells in those sectors can be minimized, thus reducing gate disturb.

Preferably, according to the second method, each first well is connected to a respective switching element. The first well of the first sector is biased with a first predetermined potential and the first wells of all other sectors of the first group of sectors are disconnected from the first predetermined potential by means of the respective switching elements at a time when the memory cells of the first sector are erased.

Preferably, according to the second method, the first predetermined potential is one of a ground potential and a substrate potential. In this way the potential difference between the channel and the gate is large enough to erase the cells in the first sector. The potential of the first wells of all the other sectors in the first group of sectors float and assumes a value close to the word line potential. As a result, the potential difference between the channel and the gate of those cells is reduced and gate disturb minimized.

Preferably, according to the first and second method, a word line potential is applied to the first group of word lines to which the memory cells of the first group of sectors are also connected. Applying a word line potential erases the memory cells being selected by the respective bit lines. In this way it is possible to erase whole sectors. For NROM cells the erasing potential is a negative potential of about 9 Volts.

BRIEF DESCRIPTION OF THE DRAWINGS

The invention will now be described in more detail below by way of non-limiting examples and with reference to the accompanying drawings, in which.

Figure 1:
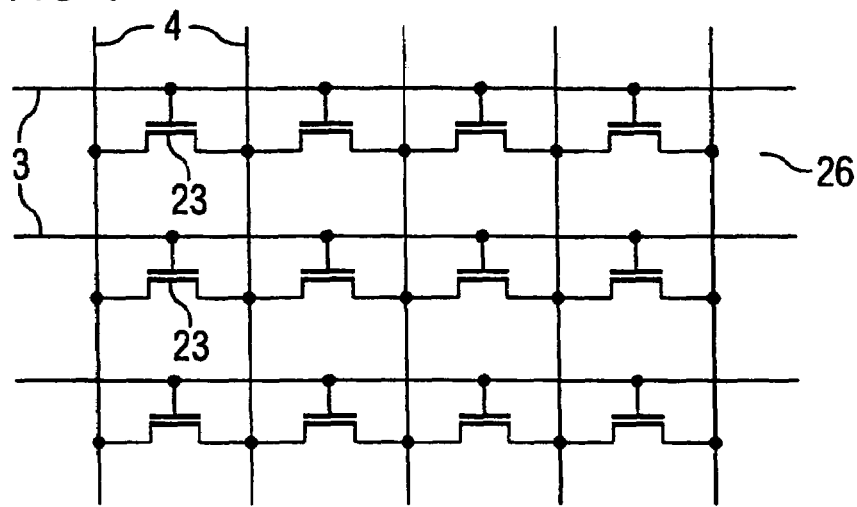
FIG. 1 shows a virtual ground array of memory cells.

The following list of reference symbols can be used in conjunction with the figures:
1 substrate region
2 first well
3 word line
4 bit line
5 gate electrode
6 first sector
7 other sectors of first group of sectors
8 group of sectors
9 switching element
10 oxide-nitride-oxide stack
11 shallow trench isolation structure
12 buried insulation layer
13 well of second doping type
14 first transistor
15 second transistor
16, 18 first source/drain contact
17, 19 second source/drain contact
20 isolation well of second doping type
21 nitride layer
22 silicon layer
23 memory cell
25 electrically insulating element
26 virtual ground array
27 first group of sectors
28 other groups of sectors
29 substrate
32, 33 oxide layer
34, 35 charge storing position
36 first group of word lines
37 other groups of word lines
38 word line decoder
39 bit line decoder
n second doping type
p first doping type
x first direction
y second direction
Cgw equivalent capacitance between gate and first well
Cws equivalent capacitance between first well and substrate
GND ground potential
I current
VE switching signal
VG gate potential
VGS potential difference between gate and substrate
VGW potential difference between gate and first well
VP predetermined potential
VP1 first predetermined potential
VP2 second predetermined potential
VS substrate potential
VW potential of first well
WL word line potential

DETAILED DESCRIPTION OF ILLUSTRATIVE EMBODIMENTS

Figure 2:
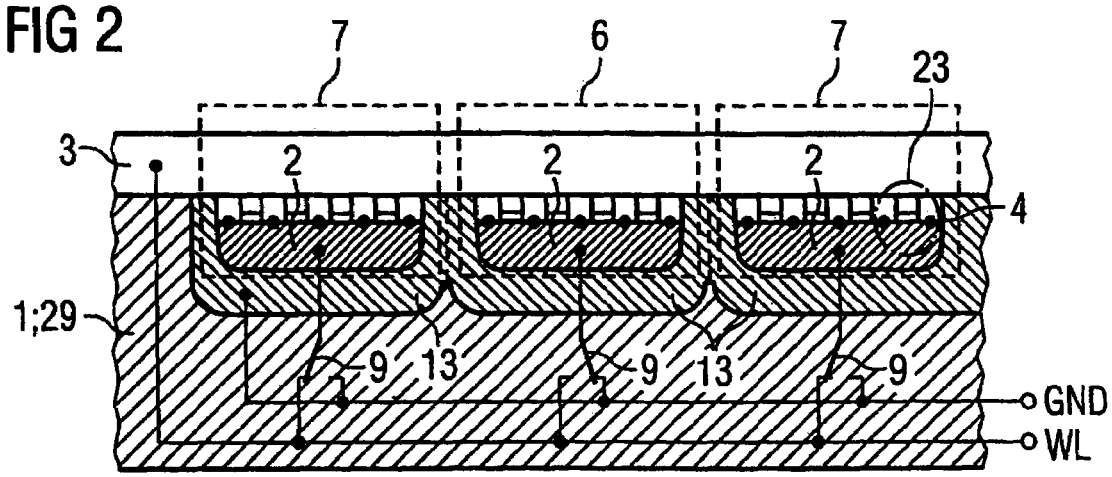
FIG. 2 shows a cross-sectional view through a semiconductor memory according to a first embodiment.

Reference is now made to FIG. 2, which shows part of a cross-sectional view through a semiconductor memory according to the invention along a word line 3. In contrast to prior art, the first wells 2 are not embedded in a substrate 1. Rather, the first wells 2 are embedded in the additional wells 13, which are then embedded in the substrate 1. The substrate 1 and the first wells 2 are made of p-type semiconductor material. In each first well 2 several memory cells 23 are embedded. The cells 23 in each first well 2 are grouped together to form the respective sectors 6, 7.

Figure 6:
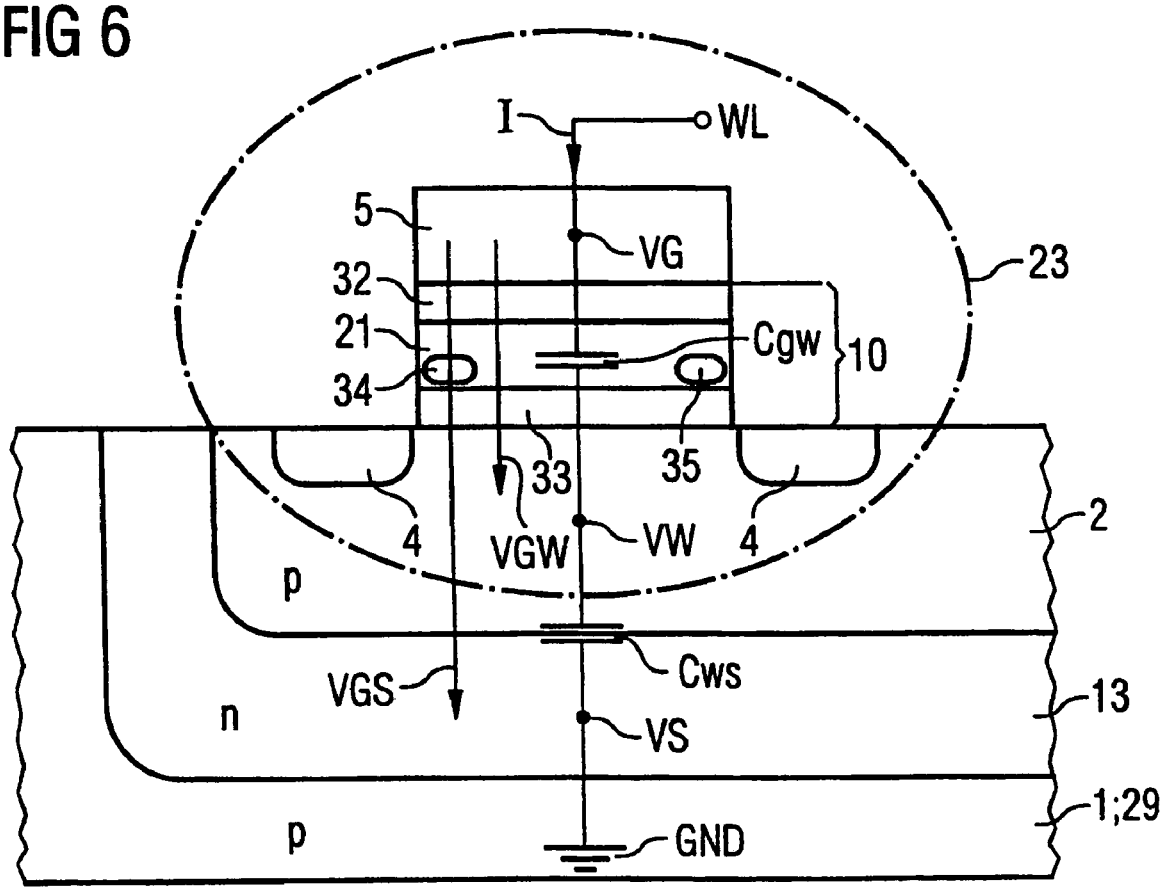
FIG. 6 shows a cross-sectional view through a memory cell schematically illustrating the capacitances between gate, the first well and the substrate of the memory cell.

Each cell 23 is connected to two bit lines 4 and a word line 3 which are used to select the cell 23 for reading, writing and erasing operations. The word line 3 is connected to the gates of all the cells 23 shown. In case of NROM cells, the detailed construction of the memory cells 23 is shown in FIG. 6 and will be described later.

Referring again to FIG. 2, if cells 23 of the middle sector 6 are erased by applying a high negative voltage to the word line 3, the same voltage will also bias the gates of the cells 23 in the sectors 7 at the left and right side of sector 6. In prior art this will lead to gate disturb in the cells 23 of sectors 7.

A preferred embodiment of the invention is shown in FIG. 2. The first wells 2 of each sector 6, 7 are embedded in additional wells 13 of a doping type opposite to the doping type of the first wells 2 and of the substrate 1. The first wells 2 and the substrate 1 may for example be made of p-type material and the wells 13 of n-type material or vice versa. As a consequence, depending on the voltages applied to the word line 3 and the substrate 1, a depletion layer is created between the first wells 2 and the wells 13 of opposite doping or between the wells 13 of opposite doping type and the substrate 1. As no charges are present in the depletion layer, it electrically insulates first wells 2 from the substrate 1. The wells 13 surround the first wells 2 on the bottom and on the sides, so that the cells wells 2 are not only insulated from the substrate 1 but also from each other. The wells 13 of the opposite doping type can be merged together to form a single well individually embedding all first wells.

The wells 13 may further be connected to the ground potential GND as shown in FIG. 2. In this case the first wells 2 will only be insulated from each other and the substrate 1 if a word line potential WL negative with regard to the ground potential GND is applied to the word line 3. This is for example the case when NROM cells are erased.

As a result of the electrical isolation of the first wells 2 of sectors 6, 7 from each other and from the substrate 1 there is no electrical potential difference between the gate and the first wells 2 and no gate disturb occurs. However, it is also no longer possible to execute read, program and erase operations. For this reason the first wells 2 need to be connected to the required predetermined potentials VP for read, program and erase operations.

For this purpose each of the first wells 2 is connected to a switching element 9. By means of the respective switching element 9 each of the first wells 2 can be electrically connected to the ground potential GND or to the word line potential WL. The switching elements 9 may be transistors.

For reading and programming cells 23, the switching elements 9 of all first wells 2 are switched such as to connect the first wells 2 to the ground potential GND. For erasing memory cells 23 in a first sector 6, the first well 2 of the first sector 6 is connected to the ground potential GND by means of the switching element 9. The switching elements 9 of the sectors 7 in which the cells 23 are not to be erased, are used to connect the respective first wells 2 to the word line potential WL, as is shown in FIG. 2. As a result there is no potential difference between the channel and the gate of the cells 23 in the sectors 7 and no gate disturb occurs when cells 23 in the first sector 6 are erased.

Figure 3:
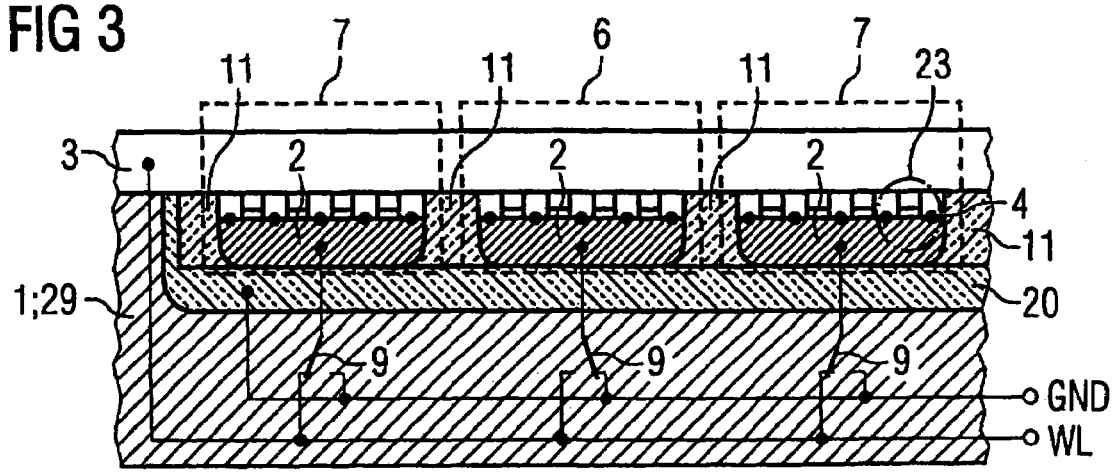
FIG. 3 shows a cross-sectional view through another semiconductor memory according to the first embodiment.

FIG. 3 shows another preferred embodiment for electrically insulating the first wells 2 from each other and from the substrate 1. In contrast to FIG. 2, instead of wells 13, a single, large isolation well 20 is provided in which all the first wells 2 are embedded. The isolation well 20 is of a doping type opposite the doping type of the first wells 2 and the substrate 1. Electrical insulation is again achieved by a depletion layer, which is used to insulate the first wells 2 from the substrate 1. However, the isolation well 20 does not insulate neighboring first wells 2 from each other, so that additional isolation structures 11 are used. In this embodiment these isolation structures 11 are shallow trench isolation (STI) structures, which must be deep enough to reach into the isolation well 20. Using individual wells 13 for each sector 6, 7, as shown in FIG. 2 requires the least process steps to achieve electrical insulation of the first wells 2. However, using one big isolation well 20 and STI structures 11 reduces the space required for the insulation.

Figure 4:
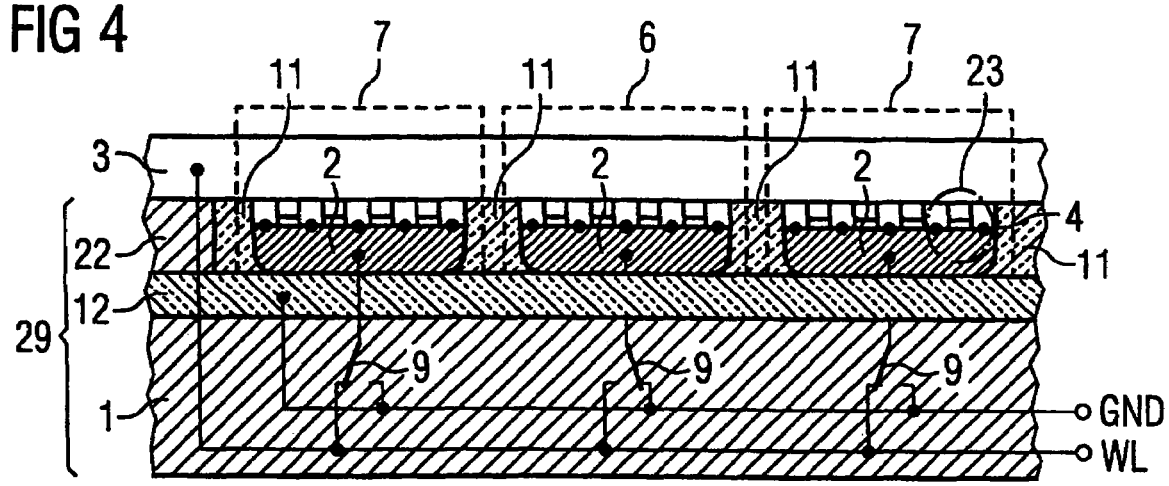
FIG. 4 shows a cross-sectional view through a further semiconductor memory according to the first embodiment.

FIG. 4 shows still another preferred embodiment for electrically insulating the first wells 2 from each other and from the substrate 1. Instead of the isolation well 20 shown in FIG. 3, a buried insulation layer 12 is used to insulate the first wells 2 from the substrate 1. A so-called silicon-on-insulator (SOI) substrate 29 may be used, which basically consists of a silicon wafer 1 with an oxide layer 12 on top and then another silicon layer 22 for the memory cell structures. Like in the preferred embodiment with the large isolation well 20 shown in FIG. 3, the neighboring first wells 2 also need to be electrically insulated from each other. This may again be achieved by shallow trench isolation (STI) structures 11 or other insulating elements. Using a silicon-on-insulator substrate with STI structures is the preferred implementation for the electrical insulating elements as the area required for insulation is drastically reduced.

In a variation of the invention the first wells 2 are no longer alternatively connectable to the ground potential GND or the word line potential WL by means of the respective switching elements, as shown in FIGS. 2 to 4. Instead of connecting the first wells 2 of the sectors 7 which are not to be erased to the word line potential WL, the potentials of the first wells 2 of the sectors 7 are left floating. The resultant potential VW of the first wells 2 is determined by a voltage divider and described later using FIG. 6.

Figure 5:
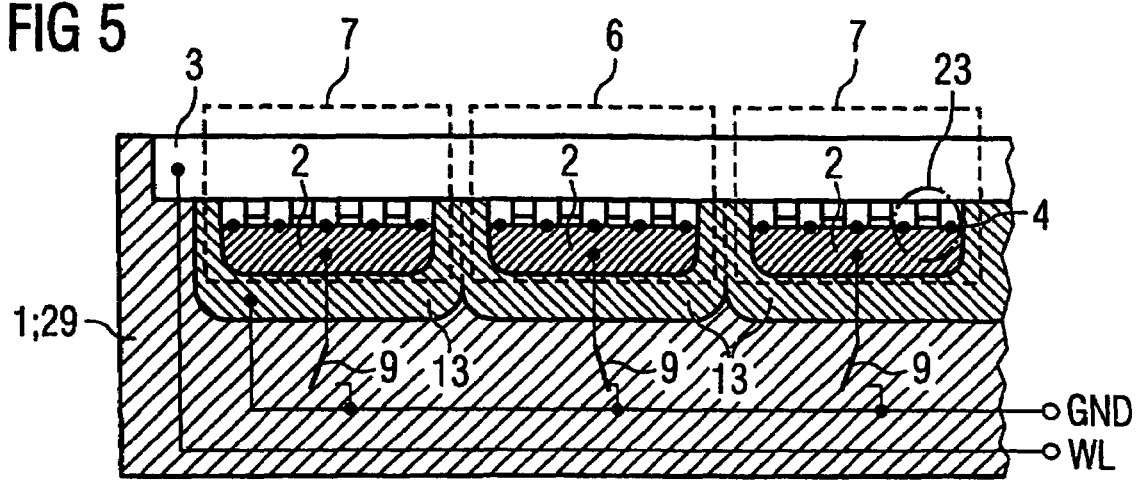
FIG. 5 shows a cross-sectional view through a semiconductor memory according to a second embodiment.

FIG. 5 illustrates an embodiment similar to the one showing in FIG. 2. Corresponding numbers refer to the same structures. The difference between the two embodiments is that the first wells 2 are no longer connected to the word line potential WL by means of the switching elements 9.

For reading and programming cells 23 in one of the sectors 6, 7, the switching elements 9 are closed so that all of the first wells 2 are connected to ground GND. To erase cells in a first sector 6, the first well 2 of the first sector 6 is connected to the ground potential GND by means of the respective switching element 9. The first wells 2 of the sectors 7 which are not to be erased are disconnected from the ground potential GND by means of the respective switching elements 9 and the potential VW of the first wells are left floating. Because the first wells 2 are insulated from each other and from the substrate 1, the potentials VW of the first wells 2 of the sectors 7, are no longer the same as the potential VW of the first well 2 in the first sector 6. As a result, the potential difference between the word lines 3 and the first wells 2 in the sectors 7 will be less and gate disturb can be reduced.

In order to calculate the potential VW of the floating first wells 2, reference is now made to FIG. 6. Shown in FIG. 6 is a section through a single NROM cell as may be used in the invention. The gate electrode 5 of the cell 23 is connected to the word line 3, which carries a word line potential WL. Below the gate electrode 5 is the so-called ONO layer 10. The ONO layer includes a nitride layer 21 sandwiched in between two oxide layers 32 and 33. Charge is stored in the nitride layer 21 at the locations 34 and 35 close to the left and right bit lines 4, respectively. Both bit lines 4 are embedded in a first well 2 made from p-type semiconductor material. The channel of the NROM cell is formed between the two bit lines 4 and lies below the ONO layer 10. To electrically insulate the first well 2 from other first wells 2 and from the substrate 1, the first well 2 is embedded in a well 13 of a second, opposite doping type n.

Also shown in FIG. 6, there are two equivalent capacitors Cgw and Cws, which are connected in series. The capacitor Cgw represents the capacitance between the gate electrode 5 and the first well 2, which is primarily caused by the insulating layers in the ONO layer 10. It is connected to the potentials VG of the gate electrode 5 and potential VW of the first well 2. The capacitor Cws is connected to the potential VW of the first well 2 and the potential VS of the well 13 of the second doping type n. It represents the capacitance of the depletion region of the PN-junction between the first well 2 and the well 13 of the second doping type n. In case a buried insulation layer 12, such as provided when using a silicon-on-insulator structure 29 and shown in FIG. 5, is used to electrically insulate the first well 2 from the substrate 1, the capacitance Cws represents the capacitance of the isolating oxide 12. The well 13 of the second doping type n is electrically connected to the substrate 1 which is connected to the ground potential GND, so that there is no depletion region between the well 13 of the second doping type n and the substrate 1.

Since the capacitors Cgw and Cws are connected in series, they carry the same charge Q and form a voltage divider. The potential difference VGW between the gate electrode 5 and the first well 2 is thus proportional to the potential difference VGS between the gate electrode 5 and the substrate 1. VGW is a function of the capacitors Cgw and Cws and can be shown to be: VGW=VGS*Cws/(Cgw+Cws).

The potential difference VGW between the gate electrode 5 and the first well 2 is what causes gate disturb in the cells 23 of the sectors 7 and should therefore be minimized. According to the above formula, VGW will be small if the capacitance Cgw between the gate electrode 5 and the first well 2 is much larger than the capacitance Cws between the first well 2 and the well 13 of the second doping type n. In this case, as the voltage of a capacitor is inversely proportional to its capacitance, most of the voltage drop across the voltage divider will occur across the smaller capacitor Cws. The voltage VGW between the gate electrode 5 and the first well 2 will be small and gate disturb will be minimized.

For a given cell size the capacitance Cgw between the gate electrode 5 and the first well 2 is much larger than the capacitance Cws between the first well 2 and the substrate 1. This is because the depletion region of the PN-junction between the triple well 13 and the first well 2, or in case a buried isolator structure is used, the thickness of the isolation oxide 12, is much thicker than the ONO layer 10. As a result, gate disturb is usually suppressed well by just letting the potential of the first wells 2 float, without connecting the first wells 2 to a word line potential WL.

FIG. 6 shows a cross-section through only one cell 23. However, in a memory array many cells 23 may be connected to the same word line 3 and the resultant gate-well capacitance is the sum of all the gate-well capacitances Cgw of the cells 23 connected to the word line 3. Similarly, the well-substrate capacity Cws depends on the size of the whole insulated area of a sector. For code flash memories Cgw is always much greater then Cws as all word lines 3 belong to one sector. For data flash memories this is not always the case, as the word lines 3 can belong to different sectors, so that depending on the size of the sector the capacitance ratio of Cgw to Cws is somewhat reduced and the invention is less effective in preventing gate disturb. However, in a so-called super-E sector, which is a huge erase sector, all the word lines 3 are used for erasing cells 23 at the same time and the invention is especially effective in minimizing gate disturb.

The embodiment shown in FIG. 5 in which the potentials of the first wells 2 of the sectors 7 float, is advantageous compared to the embodiments shown in FIGS. 2 to 4 in which the first wells 2 of the sectors 7 are connected to a word line potential WL in order to prevent gate disturb: letting the potential VW of the first wells 2 float leads to smaller capacitances which need to be charged or discharged during an erase operation.

Referring again to FIG. 6, a charging current I driven by the word line potential WL charges the capacitances Cgw and Cws. The equivalent capacitance of the series connection of the capacitances Cgw and Cws is C=Cgw*Cws/(Cgw+Cws) and is smaller than both Cgw and Cws. In case that the first wells 2 are connected to a word line potential WL, the capacitance Cgw is not charged and the equivalent capacitance is greater, being Cws. This means that the capacitance which has to be charged and discharged during an erase operation is smaller for the embodiment with the floating potential of the first wells 2. As a consequence less power is needed to charge the word lines 3 to a given potential. This is especially advantageous in battery powered applications where the current required for operating the memory should be as low as possible. Again, the larger the ratio of Cgw to Cws the more current will be saved.

With regard to the electrical insulating elements 25, the preferred embodiment of the invention shown in FIG. 5 can also be constructed in various ways, similar to the embodiments shown in FIGS. 2, 3 and 4. The electrical insulation of the first wells 2 from each other can be achieved using shallow trench isolation structures and a single isolation well 20 instead of a plurality of individual wells 13 or can be constructed using a buried insulation layer, such as provided by a silicon-on-insulator structure, together with shallow trench isolation structures.

Figure 7:
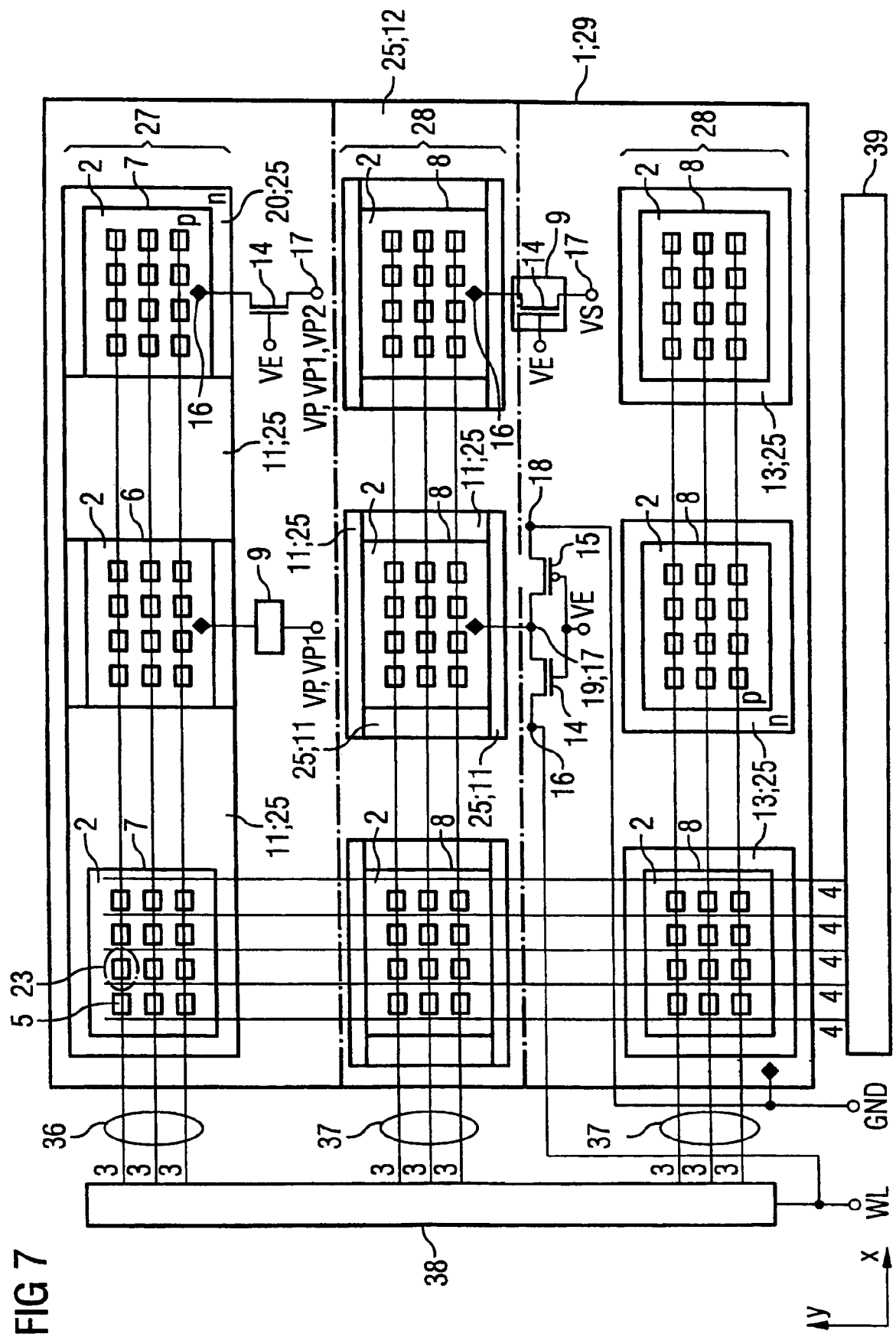
FIG. 7 shows a top view of a semiconductor memory illustrating different embodiments of the present invention.

FIG. 7 shows a top view of a semiconductor memory having a substrate 1 and sectors 6, 7, 8 arranged along the x and y direction in rows and columns. Each sector 6, 7, 8 has memory cells 23 arranged along the x and y direction along rows and columns.

A word line decoder 38 and a bit line decoder 39 are used to select memory cells 23 for read, program or erase operations by means of the bit lines 4 and the word lines 3 connected to the cells 23. Word lines 3 connecting cells 23 of a first group 27 of plural sectors 6, 7 adjacent to one another along the first direction x are forming a group 36 of word lines. Word lines 3 connecting cells 23 in other groups 28 of sectors 8 adjacent to one another along the second direction y are grouped together in another word line group 37. Bit lines 4 are only shown for cells 23 in the left column of sectors 7, 8. Of course, all cells 23 need to be connected to respective bit lines 4.

In FIG. 7, every cell 23 is represented by its gate electrode 5. Bit lines 4 pass the gates on the left and right sides, as is also shown in the cross-sectional view in FIG. 6. The cells 23 are connected to form a virtual ground array and may be nitride programmable read only memory (NROM) cells or floating gate cells, such as electrically erasable programmable read only memories (EEPROM).

In FIG. 7, different kinds of insulating elements 25 insulating the first wells 2 are illustrated for each group 27, 28 of sectors 6, 7, 8 connected to a same respective group 36, 37 of word lines. However, it is to be understood that those embodiments regarding the kind of insulating elements 25 are alternative to each other. Of course, in an actual semiconductor device all sectors 6, 7, 8 are insulated by the same kind of insulating element 25.

In the bottom row of sectors the first wells 2 of each sector 8 are of a first doping type p and are embedded in wells 13 of a second doping type n. Each first well 2 is embedded in an individual well 13. A cross-section along a word line 3 is shown in FIG. 2.

In the middle row of sectors 8 a buried insulation layer 12 is provided for insulating the first wells 2 from the substrate 1. In practice the buried insulation layer 12 extends underneath all the first wells 2 of all the sectors 6, 7, 8 of the memory and can be part of a silicon-on-insulator substrate. Electrically insulating elements 25 are used to laterally insulate the first wells 2 from each other and are placed between adjacent first wells 2 and above the buried insulation layer 12. The electrically insulating elements 25 can be shallow trench isolation structures 11 which may differ in size from the size shown. There may be only one shallow trench isolation structure 11 between two sectors 8 instead of two as shown. A cross-sectional view along one of the word lines 3 is shown in FIG. 4.

In the top row of sectors 6, 7 all the first wells 2 of a first doping type p of sectors 6, 7 are embedded in an isolation well 20 of a second doping type n. In practice, the isolation well 20 would embed all the first wells 2 of all the sectors 6, 7, 8 of the memory. Shallow trench isolation structures 11 are used to laterally insulate adjacent first wells 2 from each other. If sectors along the y-direction are also embedded in the isolation well 20, the first wells 2 must also be electrically insulated from each other in that direction by further insulating elements 11 as shown in the middle row of sectors 8. A cross-sectional view along one of the word lines 3 of the top row of sectors 6, 7 is shown in FIG. 3.

According to a preferred embodiment of the invention switching elements 9 are connected to all first wells 2 of the memory. However, for clarity sake, the switching elements 9 of sectors 7, 8 of the bottom row and the left column are not shown in FIG. 7. In FIG. 7, different kinds of switching elements 9 are illustrated. However, it is to be understood that those embodiments regarding the kind of switching element 9 are alternative to each other. Of course, in an actual semiconductor device all switching elements 9 will be of the same kind. The switching elements 9 are always connected to the respective first wells 2. Electrical connections to a semiconductor material are marked with diamonds in FIG. 7.

The switching element 9 of the middle sector 6 in the top row of sectors 6, 7 connects the first well 2 to a predetermined potential VP or a first predetermined potential VP1.

The switching element 9 of the right sector 7 in the top row of sectors 6, 7 is a transistor 14. The first source/drain contact 16 of the transistor 14 is connected to the first well 2 and the second source/drain contact 17 of the transistor 14 is connected to either a predetermined potential VP, a first predetermined potential VP1 or a second predetermined potential VP2. The gate of the transistor 14 is connected to a control signal VE.

The switching element 9 of the middle sector 6 in the middle row of sectors 8 is made up of a first transistor 14 and a second transistor 15. The first source/drain contact 16 of the transistor 14 is connected to the word line potential WL and the second source/drain contact 17 is connected to first well 2. The first source/drain contact 18 of the transistor 15 is connected to the ground potential GND and the second source/drain contact 19 is connected to first well 2. If the transistors 14, 15 are chosen to be of opposite polarity, such as PMOS and NMOS, both transistors 14, 15 can be controlled by the same signal VE.

The switching element 9 of the right sector 8 in the middle row of sectors 8 is used to connect or disconnect the first well 2 to the substrate potential VS. It is implemented as a transistor 14. The first source/drain contact 16 of the transistor 14 is connected to the first well 2 and the second source/drain contact 17 of the transistor 14 is connected to the substrate potential VS. The substrate potential VS may be the same as the ground potential GND, if the substrate 1 is connected to the ground potential GND, as shown. The gate of the transistor 14 is connected to a control signal VE.

The switching elements 9 are controlled by a signal VE. The signal VE may be obtained from the bit lines 4 used for selecting the cells 23. VE is chosen so that the first well 2 is connected to a ground potential GND or a substrate potential VS if one of the cells 23 in the first well 2 is selected by one of the bit lines 4. The signal VE may be obtained from the output of a logic OR gate which has as inputs all the bit lines 4 leading to cells 23 located in one sector 6, 7, 8 or one first well 2.

The principals of this invention to reduce gate disturb can also be applied to various read and program operations, they are not limited to the erase operation nor are they limited to NROM cells.

It will apparent to those skilled in the art that various modifications and variations can be made of the memory presented and the method of operating such a memory of the present invention without departing from the scope or the spirit of the invention. In view of the forgoing, it is intended that the present invention covers modifications and variations of this invention provided they fall within the scope of the following claims and their equivalents.

What is claimed is:

1. A non-volatile semiconductor memory comprising:
a substrate having a substrate region;
electrically insulating elements disposed in the substrate;
first wells of a first doping type disposed in the substrate, wherein the first wells are separated from the substrate region and from each other by means of the electrically insulating elements;
a plurality of non-volatile memory cells arranged in a plurality of sectors, wherein each sector comprises a plurality of non-volatile memory cells commonly arranged in a respective first well;
at least one word line, the at least one word line electrically connecting memory cells of a group of sectors among the plurality of sectors;
switching elements, wherein each first well is connected to a respective switching element and wherein the semiconductor memory is constructed such that each first well is biasable to a predetermined potential by means of the respective switching element; and
control signals coupled to and controlling the switching elements of respective ones of the plurality of sectors wherein during an erase cycle a selected first well is biased to a first predetermined potential different from the potential of the wordline and at least one other first well is biased to a second predetermined potential to reduce gate disturb during the erase cycle.

2. The semiconductor memory according to claim 1, wherein the predetermined potential to which each first well is biasable by means of the respective switching element is one of a substrate potential of the substrate region, a ground potential and a word line potential.

3. The semiconductor memory according to claim 1, wherein the switching elements comprise transistors, each transistor comprising a first and second source/drain contact, wherein the first source/drain contact is coupled to the respective first well and wherein the second source/drain contact is coupled to the predetermined potential.

4. The semiconductor memory according to claim 1, wherein each switching element (9) comprises a first and a second transistor;
wherein a first source/drain contact of each first transistor is coupled to a word line potential and a second source/drain contact of the first transistor is connected to the respective first well; and
wherein a first source/drain contact of the respective second transistor is connected to a substrate potential and a second source/drain contact of the second transistor is connected to the respective first well.

5. The semiconductor memory according to claim 1, wherein the insulating elements each comprise a well of a second doping type opposite to the first doping type; each first well being embedded in a respective well of the second doping type.

6. The semiconductor memory according to claim 1, wherein the insulating elements each comprise:
an isolation well of a second doping type opposite of the first doping type, all first wells being embedded in the isolation well; and
shallow trench isolation structures laterally separating the first wells other from one another.

7. The semiconductor memory according to claim 1, wherein the insulating elements each comprise:

a buried insulation layer arranged between the substrate region and the first wells; and shallow trench isolation structures laterally separating the first wells from one another.

8. The semiconductor memory according to claim 7 wherein the substrate comprises a silicon-on-insulator substrate.

9. The semiconductor memory according to claim 1, wherein the memory cells comprise nitride programmable read only memory cells.

10. The semiconductor memory according to claim 9, wherein the memory cells each comprise a nitride layer sandwiched between two oxide layers.

11. The semiconductor memory according to claim 10, wherein the semiconductor memory further comprises bit lines arranged in the substrate and wherein the memory cells are constructed such that electrical charges are storable in the nitride layer on two respective sides of the bit lines.

12. The semiconductor memory according to claim 1, wherein the semiconductor memory comprises an electrically erasable programmable read only memory.

13. The semiconductor memory according to claim 12, wherein the memory cells are coupled to bit lines such as to form a virtual ground array.

14. The semiconductor memory according to claim 1, wherein the semiconductor memory comprises a plurality of word lines arranged in groups of word lines;

wherein the sectors are arranged along a first and a second direction across a substrate surface;

wherein memory cells of sectors arranged adjacent to one another along the first direction are electrically connected to word lines of a same respective group of word lines; and wherein memory cells of sectors adjacent to one another along the second direction are electrically connected to word lines of other groups of word lines.

15. The semiconductor memory according to claim 14, wherein in each sector the memory cells arranged along the first direction are coupled to a same word line.

16. The semiconductor memory according to claim 14, wherein in each sector the memory cells arranged along the second direction are coupled to different word lines.

17. A non-volatile semiconductor memory comprising:
a substrate having a substrate region;
first wells of a first doping type disposed in the substrate;
a plurality of non-volatile memory cells arranged in a plurality of sectors, wherein each sector comprises a plurality of non-volatile memory cells commonly arranged in a respective first well;
at least one word line, the at least one word line electrically connecting memory cells of a group of sectors among the plurality of sectors;
electrically insulating elements, wherein the first wells are separated from the substrate region and from each other by means of the electrically insulating elements;
switching elements, wherein each first well is coupled to a respective switching element and wherein the semiconductor memory is constructed such that each first well is electrically disconnectable from the substrate region by means of the respective switching element; and
control signals coupled to and controlling the switching elements of respective ones of the plurality of sectors wherein during an erase cycle a selected first well is biased to a first predetermined potential different from the potential of the wordline and at least one other first well is biased to a floating potential to reduce gate disturb during the erase cycle.

18. The semiconductor memory according to claim 17, wherein the switching elements comprise transistors, each transistor comprising a first and second source/drain contact, wherein the first source/drain contact is coupled to the respective first well and wherein the second source/drain contact is coupled to the substrate region.

19. The semiconductor memory according to claim 17, wherein the insulating elements each comprise a well of a second doping type opposite to the first doping type, each first well being embedded in a respective well of the second doping type.

20. The semiconductor memory according to claim 17, wherein the insulating elements each comprise:
an isolation well of a second doping type opposite of the first doping type, all first wells being embedded in the isolation well; and
shallow trench isolation structures laterally separating the first wells from one another.

21. The semiconductor memory according to claim 17, wherein the insulating elements comprise:
a buried insulation layer arranged between the substrate region and the first wells; and
shallow trench isolation structures laterally separating the first wells from one another.

22. The semiconductor memory according to claim 21, wherein the substrate comprises a silicon-on-insulator substrate.

23. The semiconductor memory according to claim 17, wherein the memory cells comprise nitride programmable read only memory cells.

24. The semiconductor memory according to claim 23, wherein the memory cells each comprise a nitride layer sandwiched between two oxide layers.

25. The semiconductor memory according to claim 24, wherein the semiconductor memory further comprises bit lines arranged in the substrate and wherein the memory cells are constructed such that electrical charges are storable in the nitride layer on two respective sides of the bit lines.

26. The semiconductor memory according to claim 17, wherein the semiconductor memory comprises an electrically erasable programmable read only memory.

27. The semiconductor memory according to claim 26, wherein the memory cells are coupled to bit lines such as to form a virtual ground array.

28. The semiconductor memory according to claim 17, wherein the semiconductor memory comprises a plurality of word lines arranged in groups of word lines;
wherein the sectors are arranged along a first and a second direction across a substrate surface;
wherein memory cells of sectors arranged adjacent to one another along the first direction are electrically connected to word lines of a same respective group of word lines; and
wherein memory cells of sectors adjacent to one another along the second direction are electrically connected to word lines of other groups of word lines.

29. The semiconductor memory according to claim 28, wherein, in each sector, the memory cells arranged along the first direction are connected to the a word line.

30. The semiconductor memory according to claim 28, wherein, in each sector, the memory cells arranged along the second direction are connected to different word lines.

31. A method for operating a non-volatile semiconductor memory, the method comprising:

providing a non-volatile memory device comprising a substrate having a substrate region, comprising at least one word line, a plurality of non-volatile memory cells arranged in a plurality of sectors and further comprising first wells of a first doping type, electrically insulating elements and switching elements, wherein each sector comprises a plurality of non-volatile memory cells commonly arranged in a respective first well, wherein the first wells are separated from the substrate region and from each other by means of the electrically insulating elements, and wherein the memory cells of a first group of sectors are connected to a first group of word lines;

erasing the memory cells of a first sector of the first group of sectors selectively to memory cells of all other sectors of the first group of sectors, the erasing comprising:
electrically connecting the first well of the first sector to a first predetermined potential; and
electrically connecting the first wells of all other sectors of the first group of sectors to a second predetermined potential different from the first predetermined potential.

32. The method according to claim 31, wherein a word line potential is applied to the group of word lines to which the memory cells of the first group of sectors are also connected.

33. The method according to claim 31, wherein each first well is connected to a respective switching element, and wherein the first well of the first sector is biased to the first predetermined potential and the first wells of all other sectors of the first group of sectors are biased to the second predetermined potential by means of the respective switching elements at a time when the memory cells of the first sector are erased.

34. The method according to claim 31, wherein the first well of the first sector is biased with a ground potential or a substrate potential and the first wells of all other sectors in the first group of sectors are connected to a word line potential at a time when erasing the memory cells of the first sector.

35. A method for operating a non-volatile semiconductor memory, the method comprising:
providing a non-volatile memory that includes a substrate having a substrate region, comprising at least one word line, a plurality of non-volatile memory cells arranged in a plurality of sectors and further comprising first wells of a first doping type, electrically insulating elements and switching elements, wherein each sector comprises a plurality of non-volatile memory cells commonly arranged in a respective first well, wherein the first wells are separated from the substrate region and from each other by means of the electrically insulating elements and wherein the memory cells of a first group of sectors are connected to a first group of word lines;

erasing the memory cells of a first sector of the first group of sectors selectively to memory cells of all other sectors of the first group of sectors, the erasing comprising:
electrically connecting the first well of the first sector to a first predetermined potential; and
electrically disconnecting the first wells of all other sectors of the first group of sectors from the first predetermined potential.

36. The method according to claim 35, wherein a word line potential is applied to the first group of word lines to which the memory cells of the first group of sectors are also connected.

37. The method according to claim 35, wherein each first well is connected to a respective switching element, wherein the first well of the first sector is biased with a first predetermined potential and the first wells of all other sectors of the first group of sectors are disconnected from the first predetermined potential by means of the respective switching elements at a time when the memory cells of the first sector are erased.

38. The method according to claim 35, wherein the first predetermined potential is one of a ground potential and a substrate potential.

* * * * *